US006960497B2

(12) United States Patent
Huang et al.

(10) Patent No.: US 6,960,497 B2
(45) Date of Patent: Nov. 1, 2005

(54) METHOD FOR FORMING PI-TYPE ASSISTANT ELECTRODE

(75) Inventors: Wen-Rung Huang, Tainan (TW); Yuan-Chi Lin, Tao-Yuan (TW); Ching-Chung Cheng, Tao-Yuan (TW); Sheng-Chi Lee, Taipei (TW)

(73) Assignee: Chunghwa Picture Tubes, Ltd., Taipei (TW)

( * ) Notice: Subject to any disclaimer, the term of this patent is extended or adjusted under 35 U.S.C. 154(b) by 34 days.

(21) Appl. No.: 10/602,717

(22) Filed: Jun. 25, 2003

(65) Prior Publication Data

US 2004/0266071 A1 Dec. 30, 2004

(51) Int. Cl.[7] .................................................. H01L 21/00

(52) U.S. Cl. ........................... 438/149; 438/29; 438/30; 438/151; 438/69; 438/608; 438/609

(58) Field of Search ............................. 438/29, 30, 69, 438/149, 151, 158, 159, 608, 609

(56) References Cited

U.S. PATENT DOCUMENTS 5,252,141 A * 10/1993 Inoue et al. ................ 136/251

6,156,433 A * 12/2000 Hatori et al. ............ 428/411.1

* cited by examiner

*Primary Examiner*—Maria F. Guerrero

(74) *Attorney, Agent, or Firm*—Birch, Stewart, Kolasch & Birch, LLP

(57) ABSTRACT

The present invention provides a method for improving the adhesion capability between the π-type bus electrode and ITO (indium tin oxide) transparent conductive layer. The method includes an ITO transparent conductive layer as an ITO electrode is formed on the glass substrate by sputtering method. Then, a photoresist layer with a cavity pattern is formed on the portion of the ITO transparent conductive film. Next, an etching process is used to remove portion of the ITO transparent conductive film to form a cavity within the ITO transparent conductive film. Then, after removing the photoresist layer, a silver paste as a bus electrode is formed on the glass substrate and on the ITO transparent conductor film to form a pi (π) type bus electrode by print method. Due to the pi side of the pi-type electrode is formed on the cavity thereby the adhesion capability between the pi-type bus electrode and exposed glass substrate within the cavity, such that the adhesion capability between the π type bus electrode and ITO conductive film can be improved. Thus, the edge warp phenomenon of the π type bus electrode can be diminished.

19 Claims, 6 Drawing Sheets

METHOD FOR FORMING PI-TYPE ASSISTANT ELECTRODE

BACKGROUND OF THE INVENTION

1. Field of the Present Invention

The present invention relates to a method for forming π-type bus electrode, and more particularly, to a method for improving the adhesion capability between the π-type bus electrode and indium tin oxide (ITO) electrode.

2. Description of the Related Art

Indium is a kind of rare metal. It is similar to silver, yet the quantity of which in the crust is about 5–10%, only 1% of that of silver. In nature, indium exists in mixture with other mineral substances in very small quantity. Now about fifty kinds of mineral substances are discovered to contain indium, in which lead zinc minerals that contain sulfur has the largest quantity of indium while tinstone, wolframite, and ordinary uralite also contain a larger quantity of indium. Besides, some dust produced by thermal power plants also contains indium. At present the mineral substance that is worth industry recycling is mainly sphalerite. In general, sphalerite contains about 0.001% to 0.1% of indium.

Indium is a metal that is silver white and a little light blue, softer than lead in its hardness, the melting point of which is about 156.6° C. and the density of which is about 7.3 g/cm$^3$. It has good expandability, conductivity, and plasticity, and is able to be pressed into an extremely thin slice. Indium has chemical properties similar to those of iron, slowly reacting to oxygen in the air between normal atmospheric temperature and its melting point and forming very thin oxide film on its surface. Indium has very good anti-corrosiveness to seawater and reflectivity to light, being able to reflect almost all the colors on the spectrum. Besides, indium can form alloy with many other kinds of metal such as Ag—Pb—In alloy that can be material of bearing of high-speed aero-engine and Indium-Tin alloy that can be vacuum airtight material, material for contact of alloy of low-melting point, or binding material between glass and glass or glass and metal.

So far in the industry, the largest market of application of indium is function material. In general, indium is used in the form of indium tin oxide as transparent electrode that serves as display panel, which is widely applied in thin film transistor, liquid crystal display panel or plasma display panel.

Referring FIG. 1A, a top view of a layer of indium tin oxide transparent conductive film 102 is formed on a glass substrate 100, in which the portion of slashes is a glass substrate 100 and the other portion is an ITO transparent conductive film 120. The ITO (indium tin oxide) transparent conductive film 120 is formed on glass substrate 100 by methods such as Thermal Evaporation Deposition, sputtering, Electron Beam Evaporation, Spray Pyrolysis, Chemical Vapor Deposition, or Pulsed Laser Deposition. In these methods, sputtering process has merits such as being able to form film of large square measure, film of even thickness, and reproducible thin film and is a process that is widely used at present. And through adjusting the parameters of film that forming in sputtering process such as distance between target material and glass substrate 100, thickness of thin film, and conditions of sputtering, the properties of ITO transparent conductive film 120 can be precisely controlled.

Then, conductive layer as bus electrode such as silver paste is formed on ITO electrode 102 and glass substrate 100 by print method. A π-type (or referred to pi-type) bus electrode 104 is then formed by lithography method, the pi side 106 of the pi-type bus electrode 104 being on ITO electrode 102 and portion of stripes 108 of the pi-type bus electrode 104 being on glass substrate 100, as shown in FIG. 1B.

Since pi-type bus electrode 104 is composed of silver and small sum of glass powder, there is good adhesion capability between portion of stripes 108 of the pi-type bus electrode 104 and glass substrate 100, but worse adhesion capability between the pi side 106 of the pi-type bus electrode 104 and ITO electrode 102. Therefore, the edge warp phenomenon of the pi side 106 of pi-type bus electrode 104 will occur, as shown in FIG. 10. And the edge warp phenomenon for the pi side 106 of pi-type bus electrode 104 will cause the point discharge effect of pi-type bus electrode, which hinders the following process to proceed.

In conventional art, a layer of edge warp preventer, which is not shown in the figure, is formed on pi-type bus electrode 104 before put under the firing process to prevent the edge warp phenomenon 110 of pi side 106 of pi-type bus electrode 104 occurred when ITO electrode 102 and pi-type bus electrode 104 are under the firing process. Although a preventer can be used to prevent the pi-type bus electrode from the edge warp phenomenon, yet the cost is getting higher and the process has complicated steps, which are the disadvantages of conventional solution.

SUMMARY OF THE INVENTION

The main purpose of the invention is to improve the adhesion capability between pi-type bus electrode and ITO (indium tin oxide) electrode.

Another purpose of the invention is to prevent the edge warp phenomenon occurred of the pi side of pi-type bus electrode.

Still another purpose of the invention is to prevent from the point discharge effect of electrode.

And still another purpose of the invention is to simplify the complicated steps of the process and lower the cost of the process.

According to the purposes described above, the present invention provides a method for improving the adhesion capability between the π-type bus electrode and ITO electrode. The method includes an ITO transparent conductive layer as an ITO electrode is formed on the glass substrate by sputtering method. Then, a photoresist layer with a cavity pattern is formed on the portion of the ITO transparent conductive film. Next, a wet etching process is used to remove portion of the ITO transparent conductive film to form ITO electrode and also a cavity within the ITO transparent conductive film and to expose part of the glass substrate. Then, after removing the photoresist layer, a conductive layer as a bus electrode is formed on the glass substrate and on the ITO electrode by print method. Then a pi-type bus electrode is formed by lithography process, the pi side of the pi-type bus electrode being on the cavity on exposed portion of glass substrate and portion of stripes of the pi-type bus electrode being on glass substrate. Since there is good adhesion capability between pi side and exposed glass substrate, the adhesion capability between pi side of pi-type bus electrode and ITO electrode is also improved. Therefore, there will be less edge warp phenomenon and the point discharge effect will not occur.

DESCRIPTION OF THE PREFERRED EMBODIMENT

Some embodiments of the invention will be described in detail in the following. However, besides the detailed description, the invention can also be applied widely in other embodiments and the application scope of the invention is not limited but confined by the appended claims.

TFT technique or color twisted nematic technique are used in all the color liquid crystal display panels with high resolution, and the key material of these two kinds of monitors is indium. In the producing process of liquid crystal display panel, a very thin layer of ITO (indium tin oxide) is sputtered on glass, this ITO being called cathode sputtering, which can turn the glass into color display panel. ITO is usually used as sputtering electrode material, the essence of which is ceramic material.

Figure 1A:
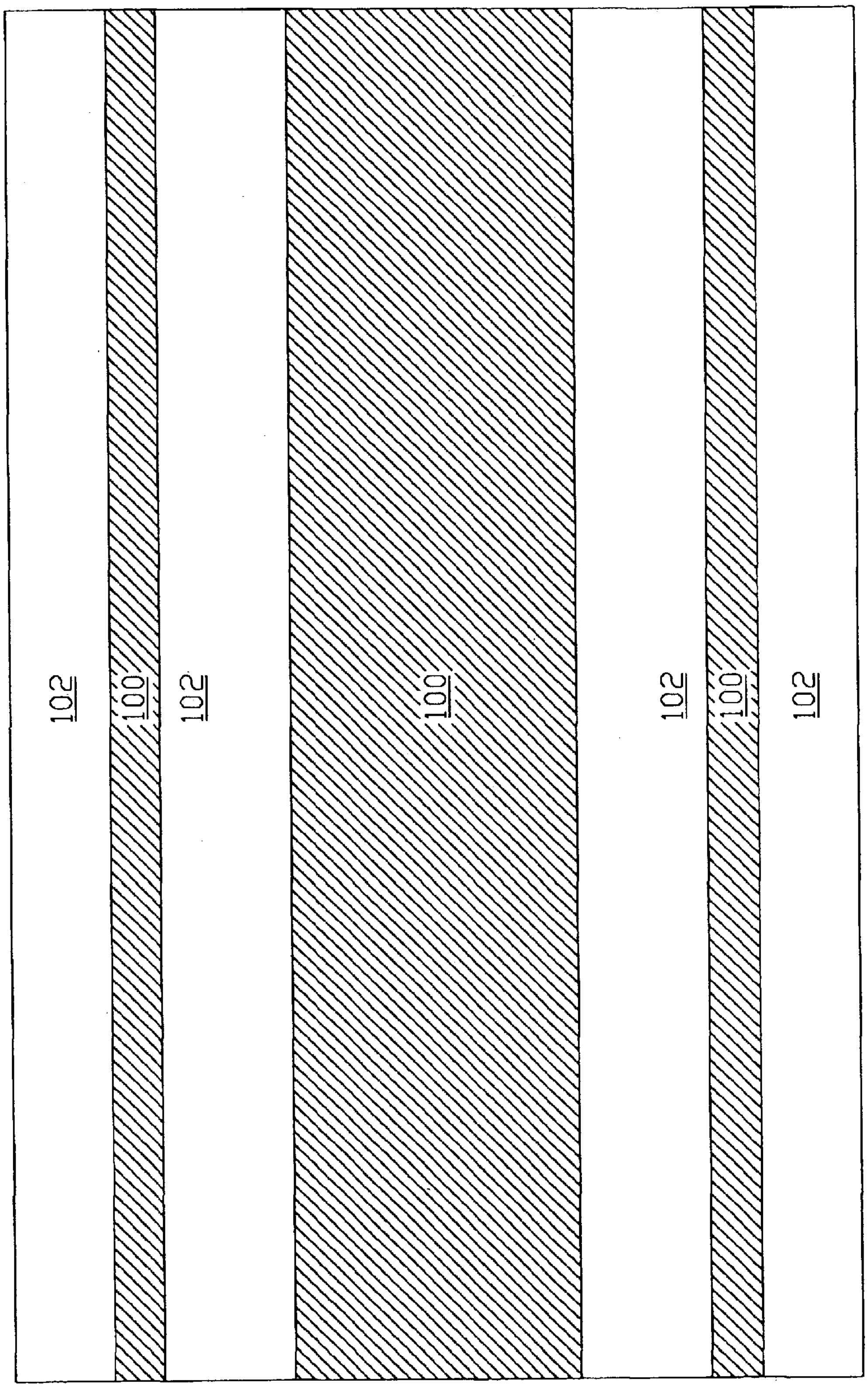
FIG. 1A to FIG. 1C are the diagrams showing the structure of pi-type bus electrode in different steps of process of conventional art in which edge warp phenomenon occurs.
Figure 1B:
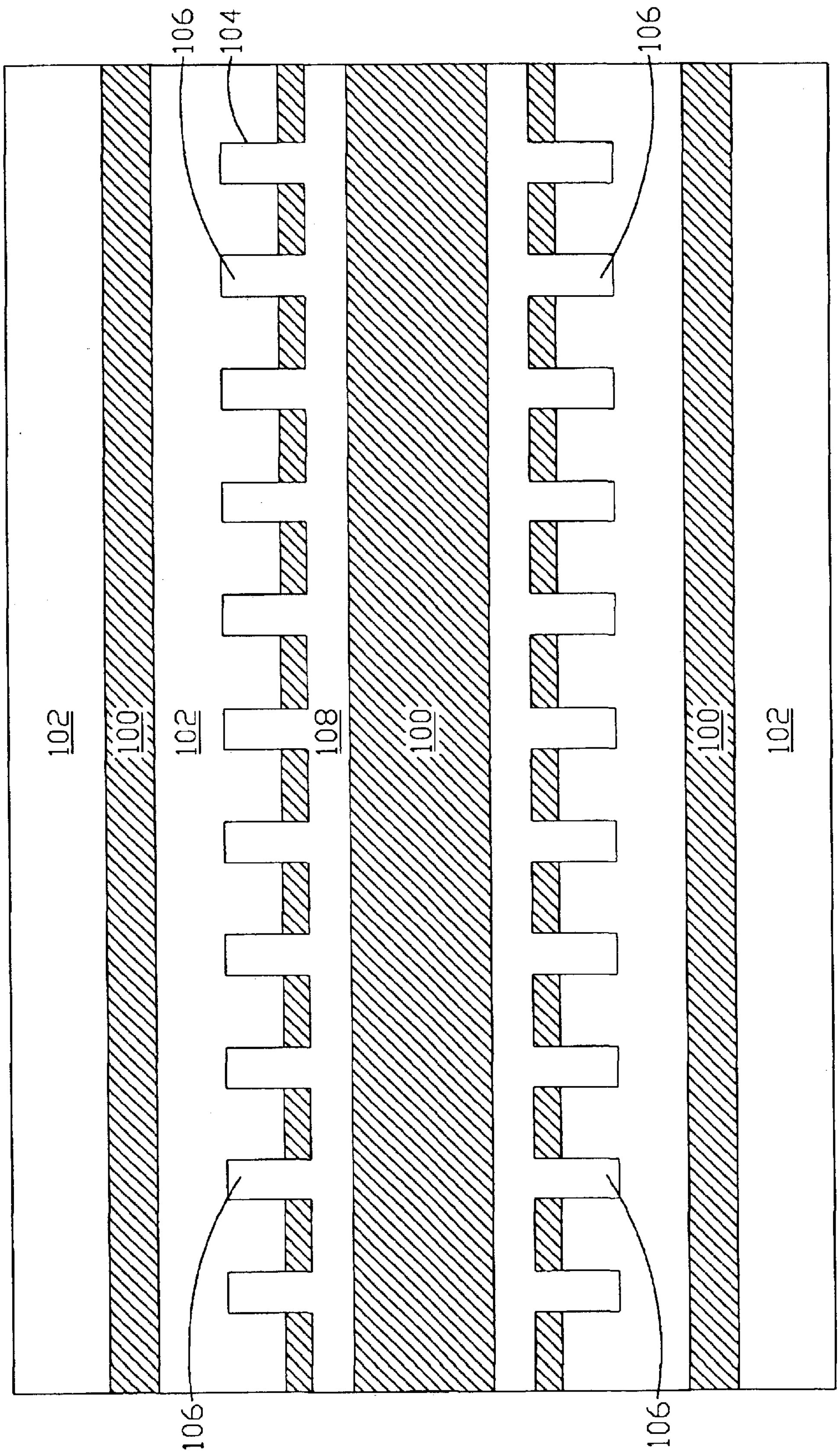
Figure 1C:
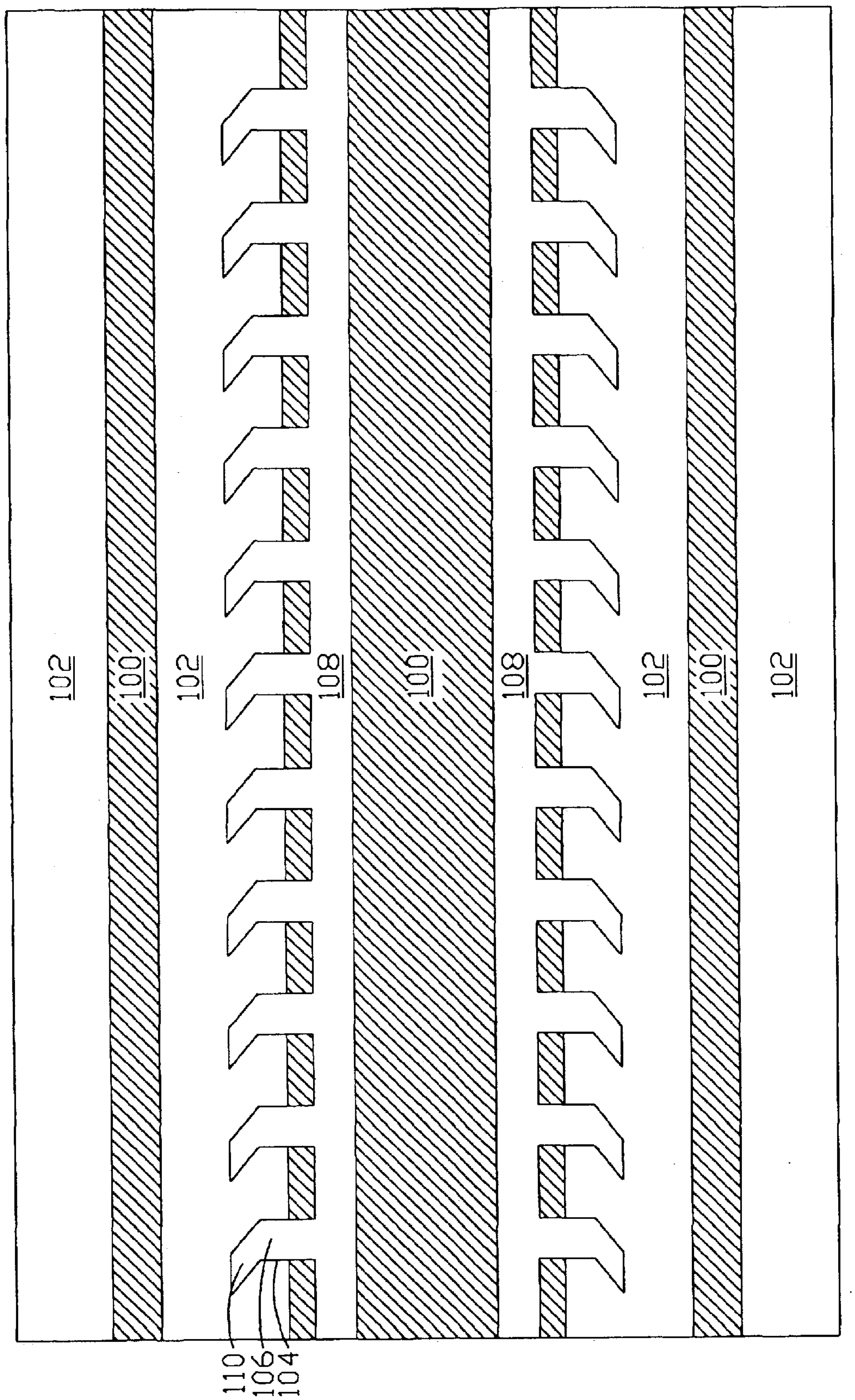
Figure 2A:
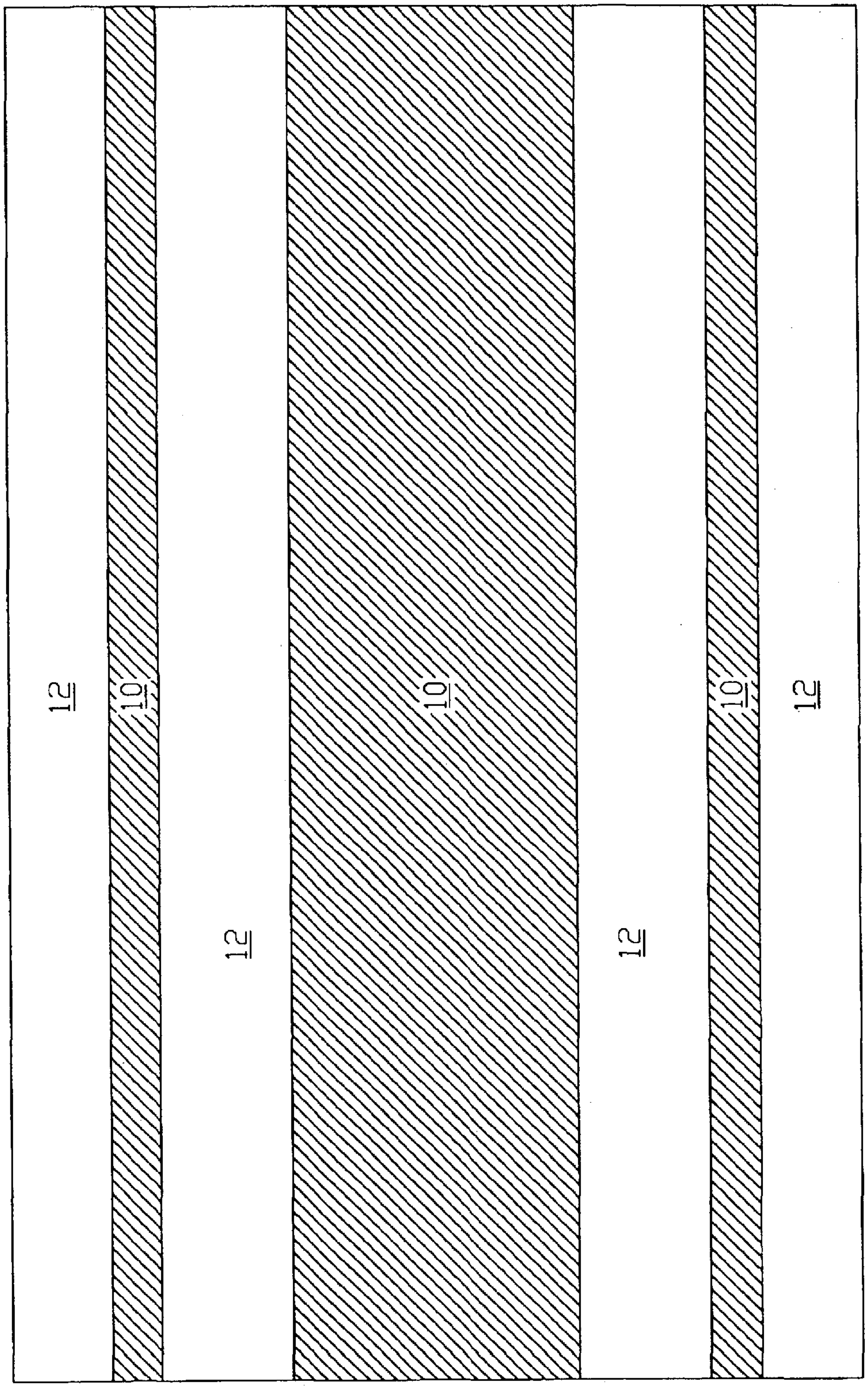
FIG. 2A to FIG. 2C are the diagrams showing the structure of pi-type bus electrode in different steps of process according to the technique disclosed in the present invention.

Referring to FIG. 2A, according to the invention, the glass substrate 10 in prior art is used as base material, and this glass substrate 10 can be divided into two kinds, one using indium metal (or indium-tin alloy) as base material, and the other using indium oxide (or with small sum of tin oxide) as base material. In the former case, methods such as reactive evaporation, reactive sputtering, or reactive ion film forming can be used; in the latter case, vacuum evaporation, high frequency sputtering, or PECVD can be used.

Then, ITO transparent conductive film 12 is formed on glass substrate 10 by sputtering method, forming a pattern as shown in FIG. 2A. In the diagram, portion of slashes is glass substrate 10 and portion without slashes is ITO transparent conductive film 12.

Figure 2B:
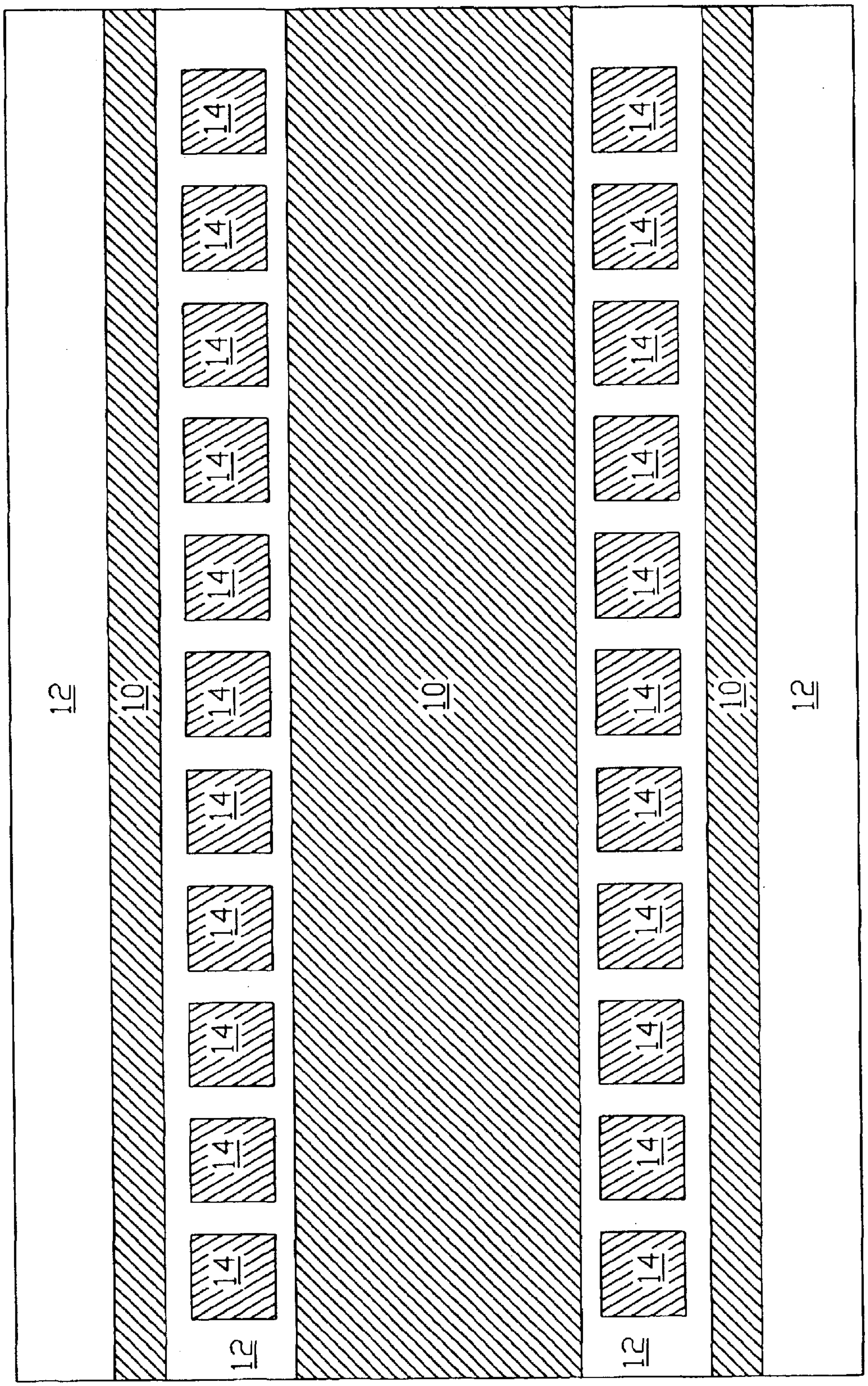

Then is one of the main features of the invention. Referring to FIG. 2B, a photoresist layer with a pattern of cavity (not shown in the drawing) is applied and is formed on ITO transparent conductive film 12. A portion of ITO transparent conductive film 12 on glass substrate 10 is then removed by wet etching method to form ITO electrode and ITO transparent conductive film 12 on pattern of cavity is also removed to expose portion of glass substrate 10 to form a cavity. The step of forming cavity 14 is to keep good adhesion capability between pi-type bus electrode formed in the following steps of the process (referring to FIG. 2C) and glass substrate 10, and therefore the adhesion capability between pi-type bus electrode 16 and ITO transparent conductive film 12 can be improved.

Figure 2C:
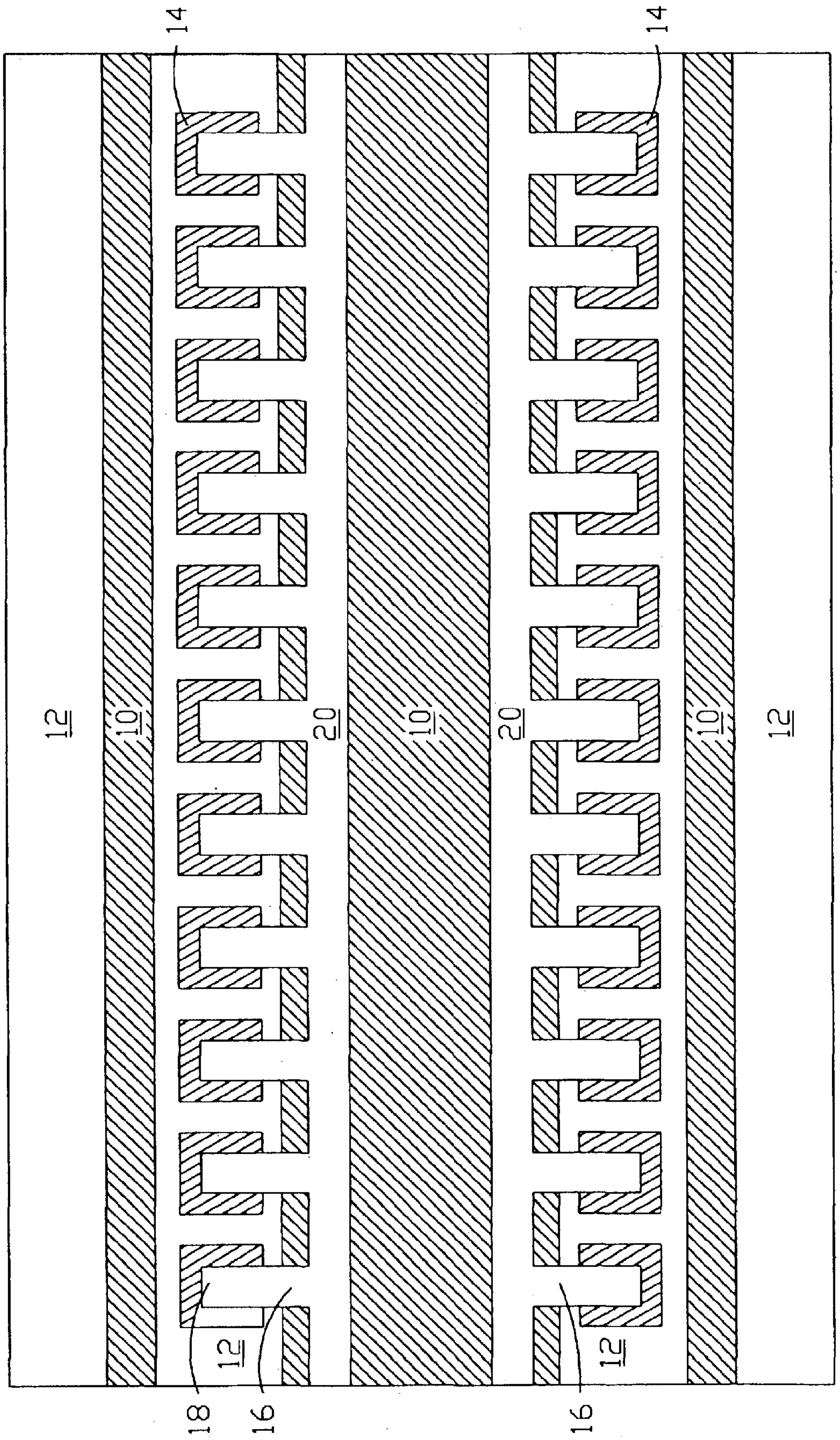

Referring to FIG. 2C, after photoresist layer is removed, glass substrate 10 with ITO electrode 12 is put under drying process, and conductive layer of pi-type bus electrode 16 such as silver paste is formed on glass substrate 10 and on ITO electrode 12 by print method. Then, a pi-type bus electrode is formed on ITO electrode 12 in lithography step. Wherein, two sides 18 of pi-type bus electrode 16 are formed on cavity 14 formerly formed in the etching process to remove ITO transparent conductive film 12. Since pi-type bus electrode 16 composes about 70% of silver and small sum of glass powder, the adhesion capability between pi side 18 of the pi-type bus electrode 16 and glass substrate 10 exposed in cavity 14 is good and the edge curl phenomenon will not occur. Besides, portion of stripes 20 of pi-type bus electrode 16 is located on glass substrate 10. Since the adhesion capability between the whole pi-type bus electrode 16 and ITO electrode 12 is improved, edge curl will not occur on pi side 18 of pi-type bus electrode, and point discharge of pi-type bus electrode will be decreased, and therefore the following steps of the process can proceed.

According to the description of embodiment above, we can conclude that the merit of the invention is to change mask pattern that is used to form ITO transparent conductive film on glass substrate in the step of forming ITO electrode in lithography process, thus when the ITO electrode is formed, portion of ITO transparent conductive film is removed to form a cavity for exposing portion of glass substrate. Therefore, pi side of pi-type bus electrode formed in the following steps can adhere to the glass substrate and edge warp will not occur. Thus, the step of applying a layer of preventer in firing process to prevent from the edge curl of electrode in conventional solution can be saved and the steps of producing process and process cost can be greatly reduced.

What is described above is only preferred embodiments of the invention, not to confine the scope of claims of the invention; the equivalent changes or modifications made within the spirit disclosed by the invention should be included in the appended claims.

What is claimed is:

1. A method for forming pi-type bus electrode, said method comprising:

providing a glass substrate;

forming a transparent conductive film with a plurality of cavity patterns on said glass substrate; and forming a bus electrode with a pi side on portion of said transparent conductive film layer and on portion of said glass substrate, said pi side being located on said pattern of cavity.

2. The method according to claim 1, wherein said forming said transparent conductive film with said plurality of cavity patterns comprises a lithography process.

3. The method according to claim 1, wherein said forming said transparent conductive film with said plurality of cavity patterns to expose portion of said glass substrate.

4. The method according to claim 1, wherein said transparent conductive film comprises an indium tin oxide (ITO).

5. The method according to claim 1, wherein said method for forming said transparent conductive film comprises a sputtering method.

6. The method according to claim 1, wherein said method for forming said bus electrode with said pi side comprises:

forming a conductive layer on said transparent conductive film;

forming a photoresist layer with a pi pattern on said conductive layer; and etching said conductive layer for forming a bus electrode with a pi side.

7. The method according to claim 6, wherein said method for forming said conductive layer comprises a print method.

8. The method according to claim 1, wherein the material of said conductive layer comprises silver.

9. The method according to claim 8, wherein the material of said conductive layer comprises glass powder.

10. A method for improving adhesion capability of electrode, said method comprises:

providing a glass substrate with a transparent conductive film, wherein said transparent film being located on portion of said glass substrate;

forming a photoresist layer with a cavity pattern on said transparent conductive film;

etching said transparent conductive film and forming a cavity pattern in said transparent conductive film and forming a transparent conductive electrode, portion of said glass substrate being exposed from said cavity pattern; and forming a bus electrode with a pi side on said glass substrate and on said transparent conductive film, wherein said pi side of said bus electrode being on said cavity pattern.

11. The method according to claim 10, wherein the material of said transparent conductive film comprises indium tin oxide.

12. The method according to claim 10, wherein said method of etching said transparent conductive film comprises a wet etching method.

13. The method according to claim 10, wherein said method for forming said bus electrode with said pi side comprises a print method.

14. The method according to claim 10, wherein the material of said bus electrode with said pi side comprises silver.

15. The method according to claim 14, wherein the material of said bus electrode with said pi side comprises glass powder.

16. A method for forming a pi-type bus electrode, said method comprising:

providing a glass substrate;

sputtering a transparent conductive film on said glass substrate;

forming a photoresist layer with a cavity pattern on said transparent conductive film;

etching said transparent conductive film to remove portion of said transparent conductive film with said cavity pattern, forming cavity pattern in said transparent conductive film, exposing said glass substrate, and forming a transparent conductive electrode;

printing a conductive layer on said transparent conductive electrode and on said glass substrate;

proceeding lithography step to form a pi-type bus electrode, wherein one pi side of said pi-type bus electrode being in said cavity and on said glass substrate.

17. The method according to claim 16, wherein the material of said transparent conductive film comprises indium tin oxide.

18. The method according to claim 16, wherein the material of said conductive layer comprises silver.

19. The method according to claim 18, wherein the material of said conductive layer comprises glass powder.

* * * * *